United States Patent [19]

Ellbrunner et al.

[11] 4,028,137

[45] June 7, 1977

[54] PROCESS FOR THE QUANTITATIVE REMOVAL OF RESIDUAL MELTS FROM CRUCIBLES

[75] Inventors: Adalbert Ellbrunner, Seibersdorf, Germany; Georg Priewasser, Ach, Duttendorf, Austria; Friedrich Georg, Braunau, Austria; Horst Stock, Burghausen, Germany

[73] Assignee: Wacker-Chemitronic Gesellschaft fur Elektronik-Grundstoffe mbH, Burghausen, Germany

[22] Filed: Nov. 10, 1975

[21] Appl. No.: 630,572

[30] Foreign Application Priority Data

Nov. 14, 1974 Germany .................. 2454092

[52] U.S. Cl. .................... 134/8; 15/211; 23/273 SP; 134/21; 141/1; 156/617 R; 156/617 SP; 156/617 H
[51] Int. Cl.² ..................... B01D 9/00; B08B 1/00; B08B 9/08

[58] Field of Search ............. 134/2, 3, 5, 21, 22 R, 134/42; 65/27; 15/1, 211; 264/39; 141/1, 7, 65, 66; 164/158; 23/273 SP; 156/616 R, 616 A, 617 R, 617 SP, 617 H, DIG. 82

[56] References Cited

UNITED STATES PATENTS

| | | | |
|---|---|---|---|
| 1,165,962 | 12/1915 | Frink | 65/27 |
| 3,010,852 | 11/1961 | Prange et al. | 134/22 R |
| 3,041,690 | 7/1962 | Mytton et al. | 264/39 |
| 3,078,151 | 2/1963 | Kappelmeyer | 23/273 SP |
| 3,086,241 | 4/1963 | Bohn | 15/211 |
| 3,093,456 | 6/1963 | Runyan et al. | 156/617 SP |
| 3,190,732 | 6/1965 | Hamilton | 23/273 SP |
| 3,218,140 | 11/1965 | Francel et al. | 134/3 |
| 3,698,872 | 10/1972 | Reusser | 23/273 SP |
| 3,704,103 | 11/1972 | Barta | 23/294 |
| 3,751,746 | 8/1973 | Elbreder | 15/260 |

Primary Examiner—Morris O. Wolk
Assistant Examiner—Bradley Garris
Attorney, Agent, or Firm—Allison C. Collard

[57] ABSTRACT

A residual melt of liquid silicon is removed from a crucible containing the same by immersing in the melt a capillary body of carbon felt, the melt being absorbed by the capillary body, and removing the capillary body and absorbed melt from the crucible.

6 Claims, No Drawings

PROCESS FOR THE QUANTITATIVE REMOVAL OF RESIDUAL MELTS FROM CRUCIBLES

BACKGROUND OF THE INVENTION

The present invention relates to a process for the quantitative removal of residual melts, especially silicon melts.

When single crystals are drawn according to the Czochralsky method, a certain amount of melt always remains after the end of the drawing. This residual melt, of for example, silicon, on cooling adheres, usually very firmly, to the crucible wall consisting, for example, of quartz glass, silicon carbide or silicon nitride. Moreover, on account of the different coefficients of thermal expansion of the two substances, the crucibles on cooling are usually destroyed, resulting in the crucibles generally not being usable more than once.

The object of the present invention therefore is to provide a process for removing such residual melts quantitatively from the crucibles or melting pots used, to make possible their further use.

GENERAL DESCRIPTION OF THE INVENTION

According to the present invention, there is provided a process for the quantitative removal of residual melts, especially silicon melts, in which the melt is absorbed by immersion therein of a suitable inert solid capillary body insoluble in this melt, and together with this capillary body is removed from the crucible containing the melt.

By capillary body is meant a body with as many as possible sufficiently narrow and outwardly-opening hollow spaces, for example, interstices between single fibres, capillaries or pores.

For carrying out the process of the present invention, it is necessary for the capillary body used to retain its solid state of aggregation. Accordingly, it is therefore necessary for the capillary body to have a distinctly higher melting point than the temperature of the residual melt to be absorbed and also to be largely insoluble in the melt and to be inert with respect thereto. Thus above all no gaseous or liquid substances must be formed by interaction of the capillary body with the material of the liquid melt.

A further essential condition in the choice of a suitable capillary body is that it should be very well wetted by the residual melt in question, i.e., the angle of contact must be as far as possible zero. Moreover, capillary bodies in which the volume of the hollow space amounts to a multiple of the volume of the substance of the body are specially suitable.

In order to carry out the process, a suitably shaped capillary body, for example, a square or cylinder, is fixed onto a holder, for example, a bar or tube of suitable material, for example, high-grade steel. Generally only the capillary body should come in contact with the melt, but not the holder to exclude unwanted reactions between the holder and the melt. The capillary body should therefore be made of sufficient length, its other dimensions depending firstly on the volume of melt to be absorbed and secondly on the space available in the plant. The capillary body fixed to a suitable holder is then lowered into the crucible from above by means of an appropriate apparatus and into the residual melt until it touches the deepest part of the crucible. As soon as the capillary body has completely absorbed the melt, it is raised until it no longer touches the crucible.

The melt taken up by the capillary body can now be solidified and removed with the capillary body from the plant. When the ratio of the hollow space volume of the capillary body to the volume of body substance is high, the mass of melt absorbed may be a multiple of the mass of the capillary body. If the plant has a capillary body which does not have sufficient volume for the absorption of the whole of the residual melt, the melt may be removed successively with several smaller capillary bodies. The crucible freed in this way from the residual melt can now be cooled to room temperature without damage and be used again for a new batch.

Carbon felt, which with respect to silicon melts, has an extraordinary absorptive power, has proved especially suitable as a capillary body material for use in the absorption and quantitative removal of residual melts. These carbon felts are made of carbon fibres which are prepared, according to known process, for example, by carbonisation of organic fibres, and have already been used for a long time as high temperature insulation material.

The hollow space-volume fraction of these carbon felts amounts to about 95%, i.e., 95% of the volume of felt can theoretically be filled with liquid silicon.

On account of the strong capillary forces for silicon in carbon felt, liquid silicon can rise very high in such a felt, far above the original level of the melt. The theoretically possible height, however, is generally not reached, since the liquid silicon cools during the rise in height, solidifies and the rising process thereby stops.

In order to ensure that the residual melt is completely absorbed in one stage, either the volume of felt must hold a sufficiently large amount or the temperature in the carbon felt above the melt level must be sufficiently high so that the rise of the melt in the carbon felt is not prematurely blocked by solidification. After the absorption of the whole of the residual melt by the carbon felt, this is lifted from the bottom of the crucible and the absorbed melt may be solidified by lowering its temperature. If the crystal drawing plant is designed for vacuum operation, it is recommended that the carbon felt, before insertion, should be degassed at high temperature in vacuo, since the non-degassed carbon felt obtainable on the market generally liberates a considerable amount of gas with a vigorous reaction on immersion in a hot melt. This can lead to spattering of a part of the melt and thus damage the crucible and plant.

The process according to the invention for the absorption and removal of hot melts by capillary bodies is not restricted to the crucible drawing operation, but can also be used in like manner in all processes in which hot melts are to be removed from crucibles without the melts being able to be quantitatively removed by simple tipping.

The advantages of the process according to the invention are that the undamaged melting crucibles may be used again, it has a simple manipulation and has low investment costs.

DESCRIPTION OF THE PREFERRED EMBODIMENT

The present invention will now be further described by means of the following example:

EXAMPLE

In a crucible drawing plant, which is usual for the production of rod-shaped silicon single crystals according to the Czochralsky method, 3.5 kg of silicon were placed in a quartz crucible and melted up in vacuo. Then, in known manner, the lower end of a seed crystal was dipped into the melt and drawn with a speed of several cm/hour with rotation, while at the adjusted temperature of the melt, a rod-shaped silicon single crystal of 54 mm diameter grew on the seed crystal. After about 90% of the silicon melt was absorbed, the crystal drawing was finished and the rod was taken out of the crucible from the top. Then a square carbon felt, of measurements 25 = 10 = 2.5 cm, which had been degassed at 400° C in vacuo and which was centered in the direction of the longest edge, was fixed to a high-grade steel rod, dipped obliquely from above into the residual melt until it touched the bottom of the crucible. After the carbon felt had quantitatively absorbed the residual melt in a few minutes, it was raised about 2 cm above the bottom of the crucible and the temperature in the plant was lowered to room temperature. The quartz crucible freed from the residual melt, after rinsing with an acid mixture, was ready again for a second batch of silicon.

What is claimed is:

1. A process for quantitatively removing a residual high temperature crystal producing melt from the interior of a crucible containing the same comprising lowering into and immersing in the melt an inert movable solid capillary body having a melting point significantly higher than the temperature of said melt and which is insoluble in the melt, for a sufficient period of time to permit the melt to be absorbed by and to rise upward into the capillary body by way of capillary action, and vertically removing the capillary body and absorbed melt therein from the interior of the crucible.

2. A process as claimed in claim 1 in which the capillary body is made of carbon felt.

3. A process as claimed in claim 1 in which the melt is liquid silicon.

4. A process as claimed in claim 1 in which the hollow space volume of the capillary body comprises about 95% of its volume.

5. A process as claimed in claim 1 which is carried out in vacuo and in which the capillary body has been degassed.

6. A process as claimed in claim 1 in which the crucible is further cleaned by rinsing with an acid mixture.

* * * * *